United States Patent
Chang et al.

(10) Patent No.: US 6,440,782 B1
(45) Date of Patent: Aug. 27, 2002

(54) RADIATION-HARD SILICON CRYO-CMOS PROCESS SUITABLE FOR CHARGE-COUPLED DEVICES, AND A DEVICE MADE ACCORDING TO THIS PROCESS

(75) Inventors: Chen-Chi P. Chang, Newport Beach; James S. Cable, San Clemente, both of CA (US)

(73) Assignee: Hughes Electronics, Los Angeles, CA (US)

( * ) Notice: Subject to any disclaimer, the term of this patent is extended or adjusted under 35 U.S.C. 154(b) by 0 days.

(21) Appl. No.: 08/706,864

(22) Filed: Sep. 3, 1996

(51) Int. Cl.$^7$ .............................................. H01L 21/339

(52) U.S. Cl. ........................ 438/145; 438/60; 438/200

(58) Field of Search ............................ 438/60, 75, 144, 438/145, 200, 588

(56) References Cited

U.S. PATENT DOCUMENTS

| | | | | |
|---|---|---|---|---|
| 5,369,039 A | * | 11/1994 | Hynecek | 438/200 |
| 5,489,545 A | * | 2/1996 | Taguchi | 438/145 |
| 5,500,383 A | * | 3/1996 | Hynecek | 438/60 |

* cited by examiner

Primary Examiner—Chandra Chaudhari
(74) Attorney, Agent, or Firm—Leonard A. Alkov; William C. Schubert; Glenn H. Lenzen, Jr.

(57) ABSTRACT

A silicon-based radiation-hard cryo-CMOS CCD process suitable for fabrication of devices (100) with sub-micron feature sizes. A re-oxidized nitride/oxide (RONO) layer (49") is preserved in the CCD area (32) while plasma etching is used to define polysilicon 1 gates (50') in the active FET area of the device. Thereafter, a wet chemical etching process, which does not destroy the integrity of the RONO layer (49") in the CCD area, is carried out. A channel stop (48) is formed after the field oxidation step in the active FET area to reduce the space required for minimum diode breakdown voltage between the n$^+$ source/drain region and the p$^+$ channel stop.

3 Claims, 4 Drawing Sheets

Figure 1:
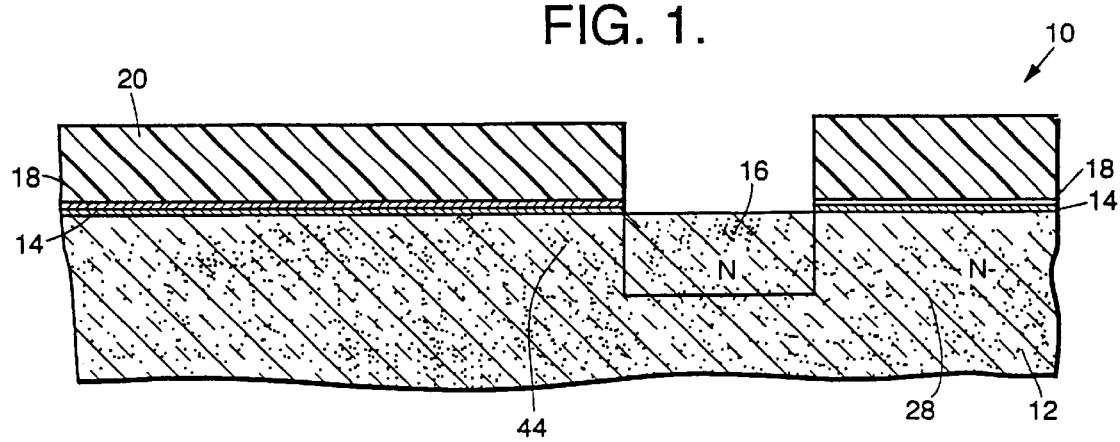

RADIATION-HARD SILICON CRYO-CMOS PROCESS SUITABLE FOR CHARGE-COUPLED DEVICES, AND A DEVICE MADE ACCORDING TO THIS PROCESS

BACKGROUND OF THE INVENTION

1. Field of the Invention

The present invention relates to silicon semiconductor devices of the complementary metal-oxide semiconductor (CMOS) type. More particularly, the present invention relates to such silicon-based CMOS devices which include a charge coupled device (CCD), which operate at cryogenic temperatures, and which are radiation-hard.

2. Related Technology

Complementary metal-oxide semiconductor (CMOS) technology is so-named because it uses both p-type and n-type metal-oxide semiconductor field-effect transistors in its circuits. CMOS is widely used in circuits in which low power consumption is important. CMOS is also used in circuits where very high noise margins are important (e.g., in radiation-hard circuits).

With the development of very large-scale integration (VLSI) circuits, power consumption in conventional n-type metal-oxide semiconductor (NMOS) circuits began to exceed acceptable limits. A lower-power technology was needed to exploit the VLSI fabrication techniques. CMOS represented such a technology. From 1968 to 1987, a 200-fold increase in functional density and a 20-fold increase in speed of CMOS VLSI integrated circuits took place. One example of this tremendous increase in density is the Intel 4004 4-bit microprocessor which in 1971 had 2,300 devices. By 1985, the well-known Intel 80386 16-bit processor had 275,000 devices.

In CMOS technologies, both n-channel and p-channel transistors must be fabricated on the same wafer. However, only one type of device can be fabricated on a given starting semiconductor substrate itself, because this substrate is doped with an n-type or p-type impurity. In order to achieve the other type of device that cannot be built in a particular substrate type itself, regions of the substrate are subjected to a doping type opposite to that present in the starting substrate material. This opposite doping is sufficient to change the type of the material to the opposite type. These regions of opposite doping (generally called wells) are among the first features to be defined in a processing wafer. This well formation is generally done by implanting and diffusing an appropriate dopant to attain the proper well depth and doping profile. The doping type of the wells becomes the identifying characteristic of a CMOS device.

Current radiation-hard cryo-CMOS devices include a very thin re-oxidized nitride-oxide (RONO) layer of about 120 Å thickness under the first polysilicon gate for the focal plane array readout circuitry (i.e., for the charge transfer structure used by the focal plane array device to control electrical charges indicative of photon flux at a particular photo-responsive receptor). The standard anisotropic plasma etch process, which is conventionally used for accurate gate definition without undercutting, for active devices formed in part by the first polysilicon layer will also attack and damage the RONO layer. Consequently, this RONO layer will not be an acceptable gate oxide layer even after a second oxidation step is performed for the gates defined by the second polysilicon layer. Accordingly, a CCD device requiring a good gate oxide under the second polysilicon gates can not be fabricated using the conventional technology.

SUMMARY OF THE INVENTION

In view of the deficiencies of conventional cryo-CMOS technology, an object for this invention is to avoid one or more of these deficiencies.

Many new applications for cryo-CMOS devices with CCD's require active device channel lengths to be in the sub-micron range (i.e., less than 1 $\mu$m) in order both to increase the speed of the devices, and to increase packing density and read-out resolution. These increased requirements are desirable while maintaining the same low-temperature radiation hardness and device performance.

Accordingly, it is an object of the present invention to provide a cryo-CMOS process which produces a radiation-hard cryo-CMOS device with ccD's, and with channel lengths in the sub-micron region without experiencing any degradation in the device radiation-hardness or the device performance.

Another object for the present invention is to provide such a cryo-CMOS process and device including CCD's, with a radiation-hardness greater than $10^5$ rads (Si).

Particularly, it is an object for this invention to provide a cryo-CMOS process and device including CCD's, with a radiation-hardness good to $1 \times 10^6$ rads (Si).

According to one aspect of the present invention, a method of fabricating a silicon-based radiation-hard cryogenic complementary metal oxide semiconductor (cryo-CMOS) charge-coupled device (CCD) includes sequential steps of: providing a silicon substrate; forming a pair of adjacent wells of opposite doping type in the substrate, and an adjacent CCD area; providing a layer of re-oxidized nitride/oxide over the CCD area; providing a layer of polysilicon over the layer of re-oxidized nitride/oxide, over the pair of adjacent wells and the adjacent CCD area; plasma etching the layer of polysilicon at the pair of wells to define a respective pair of gates for transistors to be formed in the pair of wells; and simultaneously protecting the layer of polysilicon and re-oxidized nitride/oxide over the CCD area so that both are substantially not affected by the plasma etching; and wet-chemical etching the layer of polysilicon over the CCD area to form CCD first polysilicon gates, while substantially not attacking the re-oxidized nitride/oxide layer at the CCD area with the wet-chemical etch.

According to another aspect, the present invention provides a silicon-based radiation-hard cryogenic complementary metal oxide semiconductor (cryo-CMOS) charge-coupled device (CCD) including: a silicon substrate; a pair of adjacent wells of opposite type formed in the substrate; a CCD area in the substrate adjacent to the pair of wells; a thin re-oxidized nitride/oxide layer over the CCD area which has not been compromised by exposure to plasma etching; a CCD gates formed on the re-oxidized nitride/oxide layer at the CCD area; and a CCD charge transfer control structure formed at the CCD area in association with the pair of CCD gates.

Another aspect of the present invention is that the $p^+$ channel stop is heavily doped to a level at which threshold voltage is significantly increased, preferably by a factor of approximately 20. Therefore, after a high-level radiation dose, the n-channel field threshold voltage will still maintain a desired level above the normal operation voltage to avoid turn-on of the n-channel field devices.

One of the advantages of the radiation-hard CMOS process of the present invention is that the channel length of the device can be significantly reduced to less than one $\mu$m without any degradation in the CCD performance, or device radiation-hardness. Further, with a significantly reduced channel length, the speed of the device is increased, packing density is improved, and read-out resolution is also improved while maintaining low-temperature radiation-hardness and CCD performance.

Another advantage of the present device and process is that the first CCD gate formed by a polysilicon 1 layer, and a second CCD gate formed by a polysilicon 2 layer both have the same thin layer of re-oxidized nitride/oxide (RONO) layer underneath. Accordingly, these devices should be good to at least $1 \times 10^6$ rads (Si) without failure because of radiation.

Other aspects, features, and advantages of the present invention will become apparent to those ordinarily skilled in the pertinent arts from a reading of the following detailed description of a singular exemplary preferred embodiment with reference to the accompanying drawings, in which the same reference numerals are used to indicate the same features, or features which are analogous in structure or function, throughout the several drawing Figures.

BRIEF DESCRIPTION OF THE DRAWING FIGURES

FIGS. 1 to 12 are fragmentary cross sectional views illustrating sequential steps in a process of making a radiation-hard cryo-CMOS device, and the device so made.

DETAILED DESCRIPTION OF THE PREFERRED EMBODIMENTS

Turning attention first to FIG. 1, a doped silicon processing wafer 10 is the starting material in a cryo-CMOS process embodying the present invention. The wafer 10 includes a doped silicon substrate 12 on which an oxide layer 14 is formed. Although the substrate 12 may be p-type, it is preferable for the substrate 12 to be n-type.

An n-well 16 is formed in the substrate 12, which can be carried out in any number of ways. For example, a nitride or nitride/oxide layer 18 is deposited on the substrate 12. Photoresist 20 is used to mask a pattern of windows 22 through the layers of nitride/oxide 18 and oxide 14, which layers are removed by photoengraving or etching. Ions 24 of an n-type dopant, such as atoms of phosphorus, may then be bombarded onto the silicon substrate 12 exposed in the windows 22, and will penetrate into this silicon to form the n-well 16. The n-type ions of dopant 24 may implant slightly horizontally as well as vertically.

Figure 2:
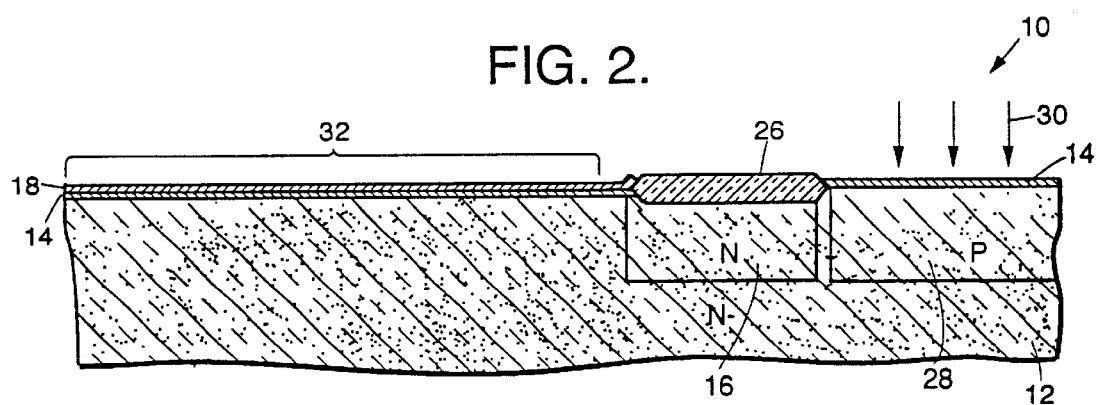

With reference to FIG. 2, a thick layer 26 of protective silicon oxide is grown on the exposed n-well 16. The nitride/oxide layer 18 is then removed over the area of the substrate 12 in which a p-well 28 is to be formed. The oxide layer 26 over the n-well 16 is grown to a thickness that is sufficient to block the implantation of bombarding ions of a p-type dopant (indicated with arrows 30), such as atoms of boron, while the remaining part of layer 18 stops the implantation of these ions elsewhere. The ions 30 of p-type dopant 30 penetrate into the silicon of substrate 12, forming the p-well 28. In view of the above, it is seen that during the implantation of p-well 28, the p-type dopant 30 penetrates the silicon substrate 12 only in the desired well area.

As pointed out above, a preferred implementation of the present radiation-hard cryo-CMOS process and device of the present invention is as a CCD focal plane array. Accordingly, a charge-coupled device (CCD) area 32 is provided next to the active transistor area including n-well 16 and p-well 28. Circuitry for a readout portion of a CCD, including CCD gates, will be located in the CCD area 32 of the device 10, as will be seen.

Figure 3:
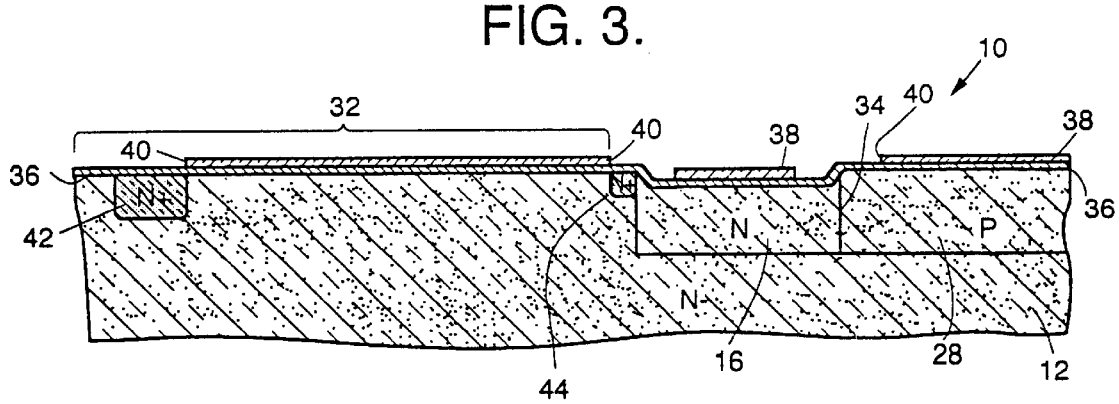

With reference to FIG. 3, the wells 16 and 28 are driven in or thermally diffused at a predetermined temperature for a certain time interval. Because the ion implantation processes 24 and 30 is unable to place the boron and phosphorus atoms deeply enough into the silicon substrate 12, these doping impurities must be diffused to appropriate depths during this subsequent high-temperature thermal diffusion cycle. As shown, the p-well 28 subsequently has a junction 34 with the n-well 16. At the conclusion of the thermal diffusion step, the doping concentration in the n-well 16 has a higher doping concentration than the n-substrate 12 to improve the punch through performance of the active transistor devices, and to eliminate the need for a separate channel-stop step for the n-well 16, as will be discussed in more detail below. That is, a higher dopant concentration in both wells 16 and 28 produces devices with relatively low capacitances at the bottoms of the source-to-well and drain-to-well junctions.

At this time, the oxide 26, oxide 14, and the nitride or nitride/oxide layer 18 are all stripped in order to allow for formation of a new oxide layer 36, and of a new nitride layer 38. The layer 38 is patterned and partially removed to define openings 40, with the remainder of this layer 38 forming an active-area mask. At this time, an additional photoresist patterning, masking and ion implantation is used to create an $n^+$-type channel stop implantation 42 in the CCD area 32.

Figure 4:
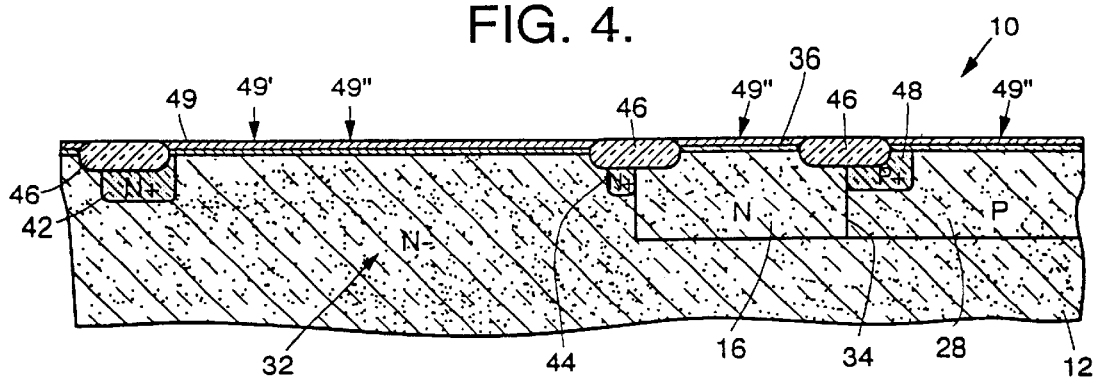

FIG. 3 shows that an $n^+$-type field implantation is carried out by appropriate masking over the structure seen in FIG. 3, and implantation of n-type dopant ions, to produce an $n^+$-type implantation 44 adjacent to the CCD area 32. That is, because the substrate material 12 of the CCD region 32 is lightly doped, the field threshold of this area is low and needs to be raised. Accordingly, n-type impurity material is implanted or doped in the CCD region 32 at implantation 44 to raise the field threshold. Thereafter, field oxide 46 is grown at the openings 40. At this time, additional masking, patterning, and ion implantation steps are used to create $p^+$-type channel stops 48, as are seen in FIG. 4. This channel stop 48 will extend partially under the field oxide 46 after diffusion. Preferably, the implantation 48 is carried out using ions formed of atoms of boron.

Those ordinarily skilled in the pertinent arts will know that when a device is in the radiation environment, after radiation exposure, the field threshold voltage drops below the normal operating voltage. As such, the device is unable to switch because it is always "on". However, with the formation of a channel stop 48, leakage current is prevented and the field threshold voltage may be raised so that the device is able to switch and function properly even after a high dose of radiation, to as much as $10^6$ rads. The boron implant in the channel stop 48 heavily dopes this channel stop and increases the n-channel field threshold voltage, thereby improving the radiation-hardness of the device at low temperatures. For example, the threshold voltage may be increased by 20 times the normal threshold voltages. In some applications, this may be about 100 volts. Therefore, after being subject to radiation and the subsequent formation of electron-hole pairs, the threshold voltage will still be maintained to a level higher than the normal operating voltage, rendering the device radiation resistant, or "radiation-hard" within a certain limit of radiation intensity. Next, the nitride layer 38 and oxide layer 36 are stripped.

Figure 5:
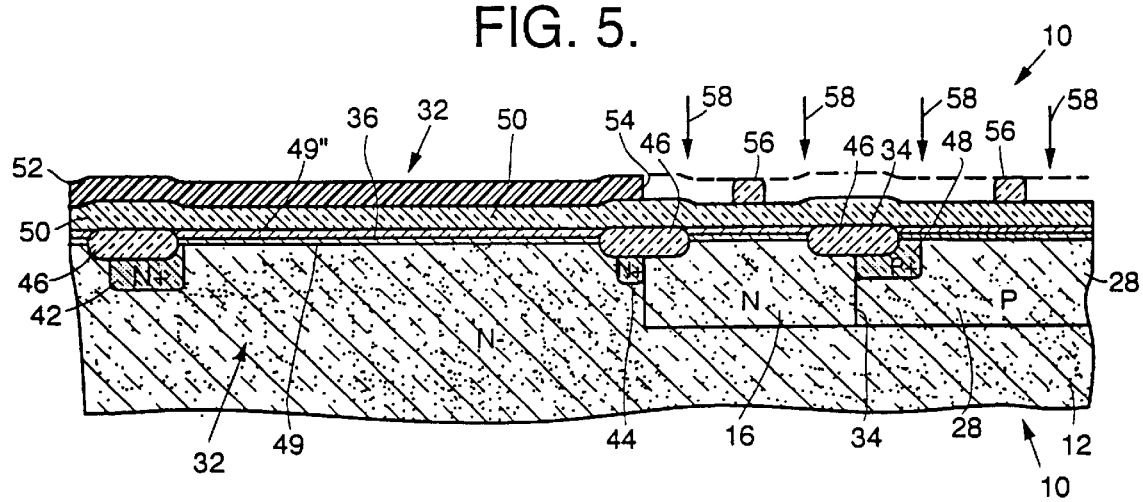

FIGS. 4 and 5 show that the next steps in the process are: a) thermal growth of a thin gate oxide indicated with reference numeral 49 (i.e., about 120 Å thick), b) nitriding the thin gate oxide 49 (indicated with numeral 49'), c) re-oxidizing this nitrided thin gate oxide layer (indicated with the arrowed reference numeral 49"—thus forming the RONO layer), and d) the application of a first polysilicon layer 50 (i.e., polysilicon 1, or PS1). Hereinafter, the re-oxidized nitrided oxide layer is referred to with numeral 49". This step results in PS1 50 over the wells 16 and 28. A photoresist mask layer 52 is applied and patterned to leave openings 54. The openings 54 cooperatively define islands 56 of photoresist layer 52 over the future locations of gates (to be described below) for the FET transistors to be formed in wells 16 and 28. The photoresist layer 52 is continuous over the CCD area 32.

FIG. 5 also shows that the PS1 layer 50 is plasma etched (indicated by arrows 58) so that the openings 54 are extended through the PS1 layer 50 to the RONO layer 49". The islands 56 of photoresist layer 52 cause the creation of gates 50= and 50" (seen in FIG. 6) formed of PS1 in the active area of the device. The photoresist layer 52 is effective to resist this plasma etching 58, and to protect the poly 1 layer 50 in the CCD area 32. Thus, the integrity of the RONO layer 49" in the CCD area 32 is protected.

Figure 6:
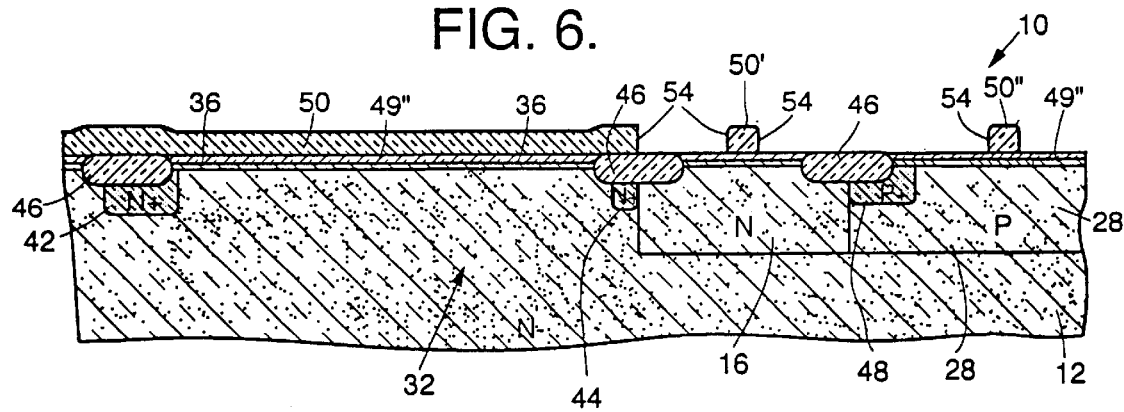

As FIG. 6 illustrates, the PS1 layer 50 is patterned over the wells 16 and 28 to provide polysilicon gate portions 50' and 50", at the wells 16 and 28 respectively, as was noted above. The portion of polysilicon layer 50 over the CCD area 32 remains, and is substantially unaffected by the plasma etch operation. Photoresist layer 52 is then removed, at FIG. 6 illustrates.

Next, the structure seen in FIG. 6 is subjected to a masking, patterning, and wet-chemical etch effective at the CCD area 32 to partially remove the overlying layer 50 of PS1, and to create islands (i.e., gates) 60 of PS1 layer 50 in the CCD area 32 (only two of which are seen in the drawing Figures). As opposed to the plasma etching operation, the wet-chemical etching operation only minimally attacks the RONO layer 49". Consequently, between the gates 60, where the RONO layer 49" is exposed, this RONO layer 49" has substantially the same thickness (and radiation hardness) as it has between these gates (i.e., between the PS1 layer) and the substrate 12.

Figure 7:
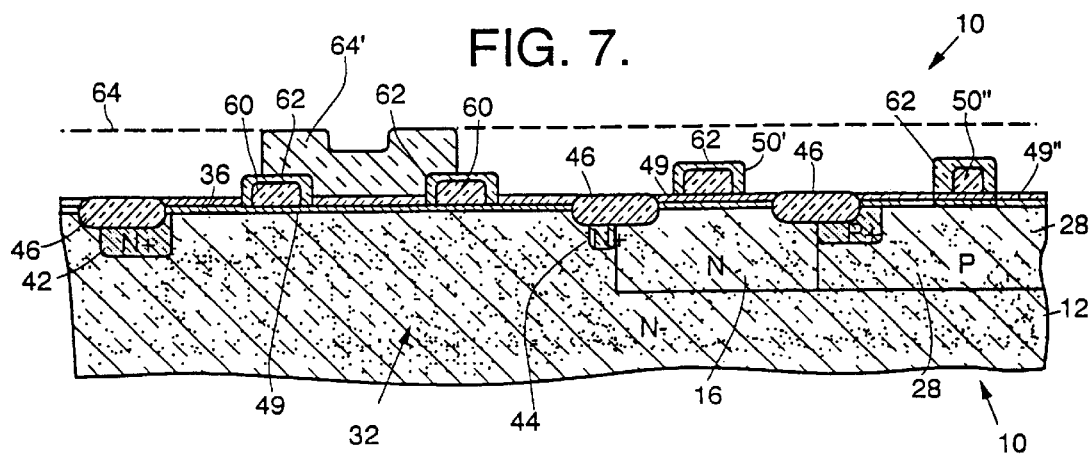

FIG. 7 also shows that all of the PS1 islands (i.e., 50', 50", and at both islands 60, which are gates) the remaining portion of PS1 layer 50 is then partially surface-oxidized to provide a layer 62 of polysilicon oxide. The thickness of the RONO layer 49" stays the same even after this oxidation step because of the nitriding of this RONO layer 49".

Next, a second layer of polysilicon (i.e., polysilicon 2, or PS2), indicated by dashed line 64, is applied over the structure previously described. This PS2 layer is masked, patterned, and partially removed to provide in the CCD area 32 a conductive CCD charge transfer control structure 64'. This control structure 64' is formed of the remaining part of PS2 layer 64 in cooperation with the gates 60 and intervening polysilicon oxide layers 62. That is, the structure 64' is electrically separated from the PS1 islands 60 by intervening polysilicon oxide layer 62. This polysilicon oxide layer serves as dielectric for the CCD charge transfer control structure 64'. It will be noted that the RONO layer 49" has substantially the same thickness between the gates 60 and substrate 12 as it has between structure 64' (i.e., the remaining portion of PS1 layer 64) and substrate 12.

Figure 8:
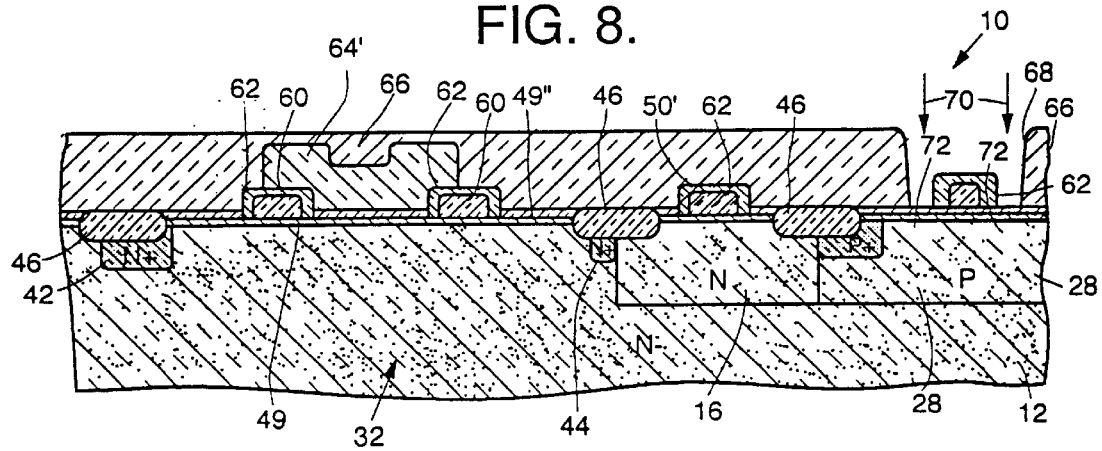

With reference to FIG. 8, a photoresist n$^+$-mask 66 is applied over the structure so far described, and is patterned during application to provide an opening 68 over the p-well 28. Next, n-type dopant ions (indicated by arrows 70) are bombarded onto the exposed surface of substrate 12, and into the p-well 28 to created n$^+$-type source and drain implantations 72.

Figure 9:
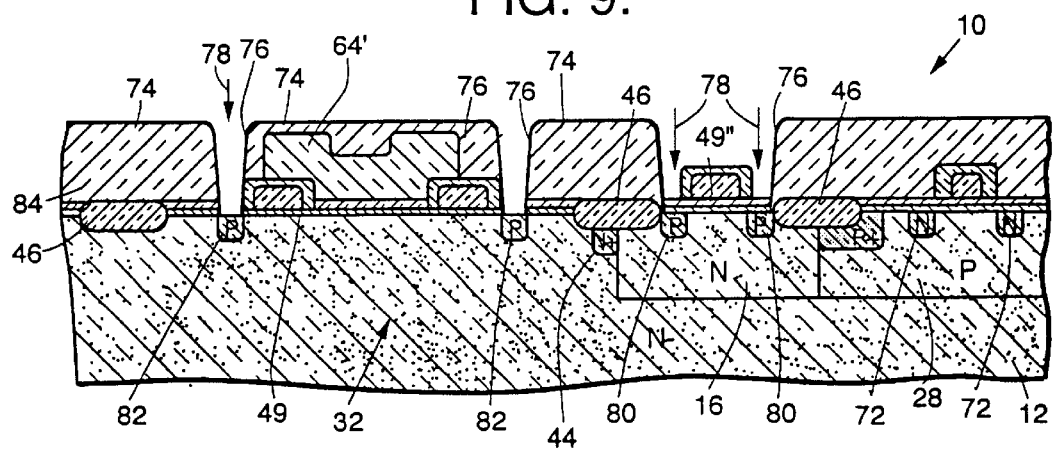

The mask 66 is then stripped, and FIG. 9 shows that a similar photoresist mask 74 is applied and patterned to provide openings 76. P-type dopant ions (indicated by arrows 78) are bombarded onto the exposed surface of substrate 12 at the CCD area 32, and into the n-well 16 to create p$^+$-type source and drain implantations 80. Also, this bombardment with p-type dopant ions is effective to also form p-type implantations 82 adjacent to the CCD gate structures 60.

Figure 10:
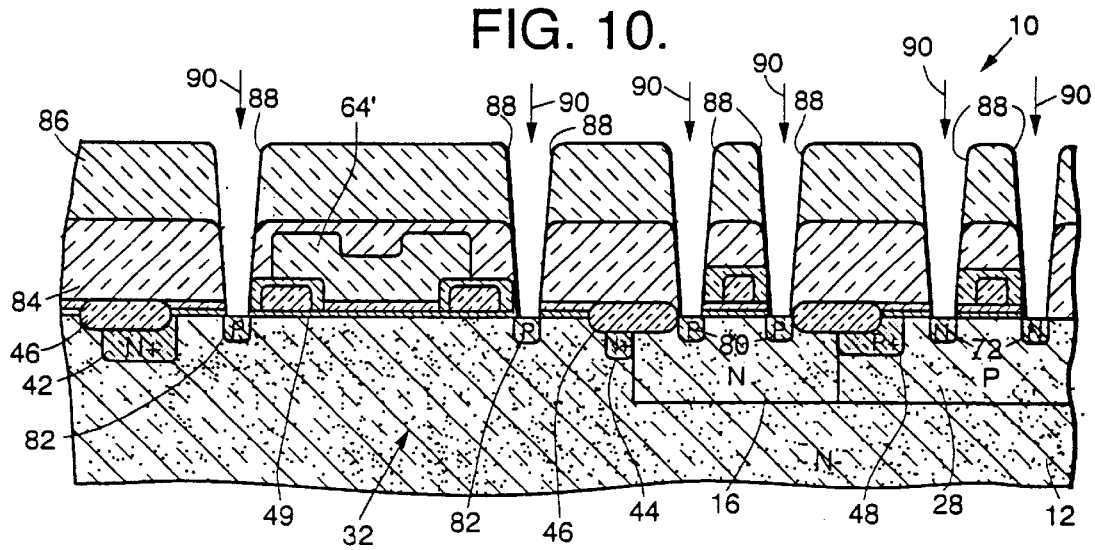
Figure 11:
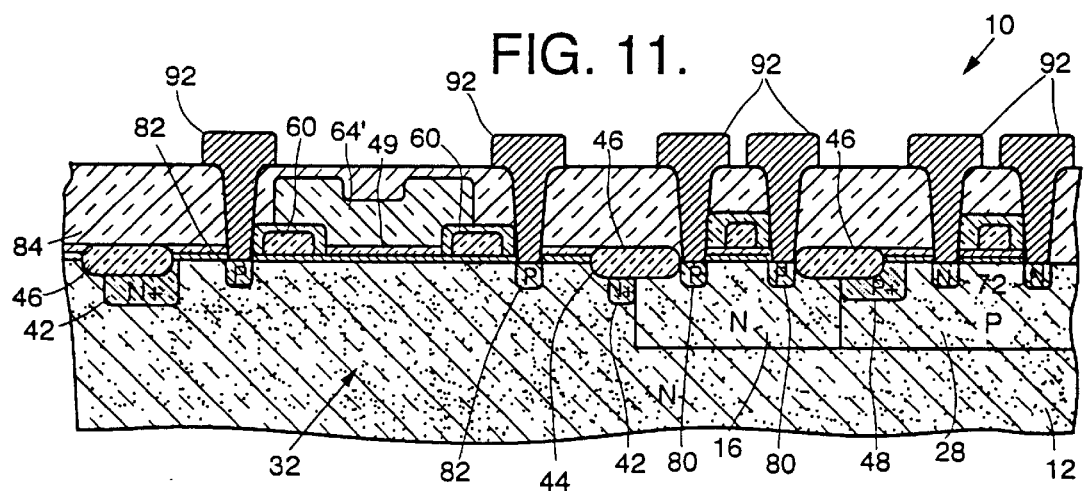

FIG. 10 shows that the mask 74 is stripped, and is replaced with a thick layer 84 of insulation material. For example, the material of layer 84 may be an oxide glass. Over the layer 84 is applied a layer 86 of photoresist. This photoresist layer 86 is patterned to provide openings 88. A plasma etching operation (indicated by arrows 90) is carried out, etching down to the layer of silicon 12 (i.e., the openings 88 are extended from the layer 86 of photoresist through the oxide glass 82, and RONO layer 49"). The openings 88 subsequently extend down to the n-type source and drain implantations 72, and to the p-type implantations 80, and 82.

Subsequently, layer 86 is removed. Conductive metal (i.e., metal 1) is deposited, and is patterned to form contacts 92 (illustrated in FIG. 11) and lines atop the insulative layer 84. The metal 1 conductive contacts 92 make respective electrical connections with the n-type and p-type source and drain implantations 72, and with the p-type implantations 80 and 82.

Figure 12:
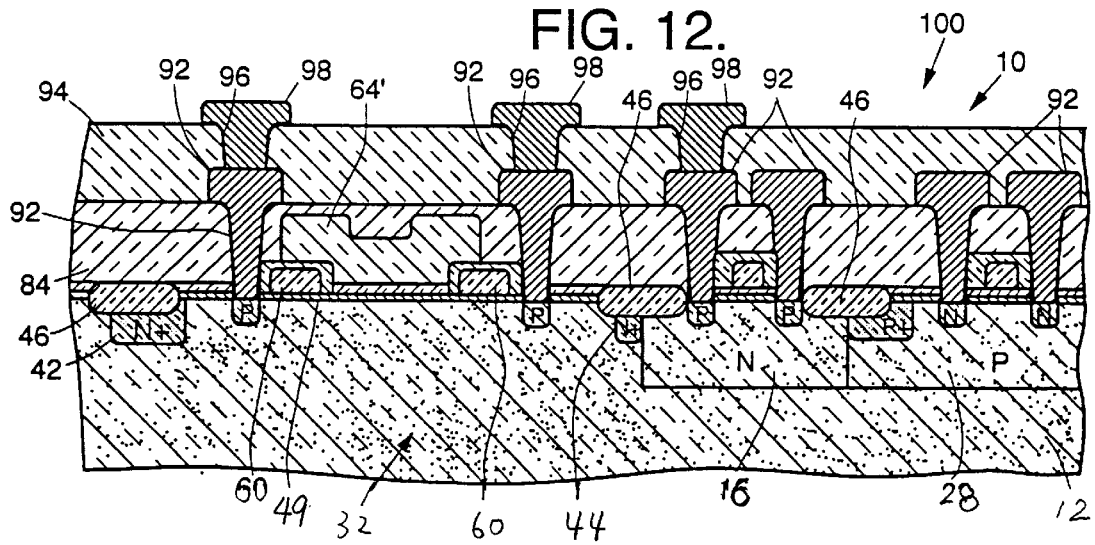

Next, as is illustrated by FIG. 12, another thick layer 94 of insulation material is formed atop the layer 84, and over the contacts and lines 92 formed of metal 1. Again, the material of layer 94 may be an oxide glass. Over the layer 94 is applied a layer of photoresist (not illustrated), which is patterned and partially removed to allow openings 96 to be formed in the layer 94 by etching. Now a second conductive metal is applied (i.e., metal 2), and is patterned to form contacts 98. Again, those ordinarily skilled in the pertinent arts will recognize that the metal 2 layer may be used to form a respective level of interconnections (not shown) among the features of the device. The photoresist layer is then removed to provide the device 100 shown in FIG. 12.

Importantly, it is seen that the device 100 will provide a silicon-based cryo-CMOS device which includes a charge coupled device (CCD), which operates at cryogenic temperatures, and which is radiation-hard. An advantage of the device for both operation in radiation environments and in ordinary environments, is that the RONO layer 49" at the CCD area has substantially the same thickness between gates 60 and substrate 12 as it has between structure 64' and substrate 12. Thus, the radiation hardness of the device is preserved for devices configured to be radiation hard. For devices configured to operate under ordinary conditions, the reliability of the device is improved by the uniformity of the RONO layer 49" at the CCD area 32.

While the present invention has been depicted, described, and is defined by reference to a single particularly preferred embodiment of the invention, such reference does not imply a limitation on the invention, and no such limitation is to be inferred. The invention is capable of considerable modification, alteration, and equivalents in form and function, as will occur to those ordinarily skilled in the pertinent arts. The depicted and described preferred embodiment of the invention is exemplary only, and is not exhaustive of the scope of the invention. Consequently, the invention is intended to be limited only by the spirit and scope of the appended claims, giving full cognizance to equivalents in all respects.

What is claimed is:

1. A method of fabricating a silicon-based radiation-hard cryogenic complementary metal oxide semiconductor (cryo-CMOS) charge-coupled device (CCD), said method comprising sequential steps of:

provide a silicon substrate;

forming in a CMOS active device area a pair of adjacent wells of opposite doping type in said substrate, and an adjacent CCD area;

providing a layer of re-oxidized nitride/oxide over said CCD area and said CMOS active device area;

providing a layer of polysilicon over said layer of re-oxidized nitride/oxide, over said pair of adjacent wells and said adjacent CCD area;

plasma etching said layer of polysilicon at said pair of wells to define a respective pair of gates for transistors to be formed in said pair of wells; and simultaneously protecting said layer of polysilicon and re-oxidized nitride/oxide over said CCD area so that both are substantially not affected by said plasma etching;

wet-chemical etching said layer of polysilicon over said CCD area to form first polysilicon gates for said CCD area, while substantially not attacking said re-oxidized nitride/oxide layer at said CCD area with said wet-chemical etch.

2. The method of claim 1 wherein said substrate providing step includes providing a silicon substrate of n-type; including in said pair of wells one n-type well and one p-type well defining a junction therebetween; and forming a channel stop in said p-well.

3. The method of claim 1 further comprising the step of heavily doping said channel stop to a level at which threshold voltage is increase by a factor of approximately 20.

* * * * *